(12) United States Patent
Holdermann

(10) Patent No.: US 6,451,218 B1
(45) Date of Patent: Sep. 17, 2002

(54) METHOD FOR THE WET CHEMICAL PYRAMIDAL TEXTURE ETCHING OF SILICON SURFACES

(75) Inventor: Konstantin Holdermann, Offingen (DE)

(73) Assignee: Siemens Solar GmbH, Munich (DE)

(*) Notice: Subject to any disclaimer, the term of this patent is extended or adjusted under 35 U.S.C. 154(b) by 0 days.

(21) Appl. No.: 09/272,022

(22) Filed: Mar. 18, 1999

(30) Foreign Application Priority Data

Mar. 18, 1998 (DE) .......................... 198 11 878

(51) Int. Cl.$^7$ .......................... B44C 1/22; H01L 21/302
(52) U.S. Cl. .......................... 216/99; 438/753; 252/79.5
(58) Field of Search .......................... 216/99; 438/753; 252/79.5

(56) References Cited

U.S. PATENT DOCUMENTS

| | | | |
|---|---|---|---|
| 3,909,325 A | 9/1975 | Church et al. .............. | 438/753 |
| 3,940,356 A | 2/1976 | Byrnes ...................... | 260/29.6 |
| 4,137,123 A | 1/1979 | Bailey et al. ............... | 438/753 |

FOREIGN PATENT DOCUMENTS

GB          1 250 653          1/1968

OTHER PUBLICATIONS

King et al, "Experimental Optimization of an Anisotropic Etching Process for Random Texturization of Silicon Solar Cells", *IEEE*, 1991, pp. 303–308.

*Primary Examiner*—Randy Gulakowski
*Assistant Examiner*—Shamm Ahmed
(74) *Attorney, Agent, or Firm*—Christie, Parker & Hale, LLP

(57) ABSTRACT

A new and improved etching solution and etching method provide wet chemical pyramidal texture etching of (100) silicon surfaces. A uniform and completely pyramidal texture etching of silicon surfaces is achieved with an etching solution including water, an alkaline reagent, and isopropanol together with an aqueous alkaline ethylene glycol solution.

16 Claims, 4 Drawing Sheets

METHOD FOR THE WET CHEMICAL PYRAMIDAL TEXTURE ETCHING OF SILICON SURFACES

BACKGROUND OF THE INVENTION

The present invention relates to a method for the wet chemical pyramidal texture etching of silicon surfaces.

A textured surface reduces the reflection of incident light across wide bands, thereby increasing the absorbed light intensity. When manufacturing crystalline silicon solar cells, a systematic structuring of the silicon surface leads to an increase in solar cell performance. Such a wet chemical structural etching is not, however, restricted just to the processing and production of solar cells, but is also suitable for optical and electrochemical detectors/sensors, biodetectors/biosensors, catalysts, electrodes and the like.

Known techniques for the wet chemical pyramidal structural etching of (100)-oriented silicon surfaces use alkaline media, mainly with solutions of alkali hydroxides, alkali carbonates, ammonia or choline. Solutions of hydrazine or ethylene diamine/pyrocatechol can also be used, but they are disadvantageous on account of their toxicity. The most common recipes comprise water, sodium or potassium hydroxide and alcohol. The alcohol component used is either ethylene glycol or isopropanol. Nevertheless, the known methods for the wet chemical structural etching of silicon merely relate, purely and simply, to the generation of a pyramidal (tetragonal) texture.

In terms of fine line metalization and the application of doping resists or photoresist, however, a texture that exhibits small pyramids is desirable. A method based on an etching solution that contains ethylene glycol is described in EP 0 477 424 A1. The etching solution recipe used here contains water, potassium hydroxide, ethylene glycol and silicon. Oxygen is also added as a further component. After the silicon surface has undergone wet chemical structural etching, reproducibly uniform pyramids are obtained by aerating the etching solution with oxygen. The pyramid height can be varied by the aerating duration of the etching solution. Introducing oxygen over a longer period, i.e. greater oxidation of the glycol, results in smaller pyramids. In this way, pyramid sizes of $\leq 2$ $\mu$m can be produced even in terms of manufacturing engineering. But the disadvantage is that the etching solution based on ethylene glycol cannot be used ad hoc because it requires a preceding dissolution of silicon. Studies have shown that a subsequent rest phase of several hours proves to be beneficial for formation of smooth (111) faces. A simple addition of silicate solution does not lead to success.

Methods which use an etching solution based on isopropanol are known for example from U.S. Pat. No. 3,998,659, from "Uniform Pyramid Formation on Alkaline-etched Polished Monocrystalline (100) Silicon Wafers", Bressers et al., Progress in Photovoltaics, Vol. 4, 435–438 (1996), and from "Experimental Optimization of an Anisotropic Etching Process for Random Texturization of Silicon Solar Cells", King et al., IEEE 1991, 303–308. In contrast to the etching solution based on ethylene glycol, an IPA-based etching solution can be used immediately for the purpose of texture etching. This etching solution can be used with and without silicate. This type of solution nevertheless suffers from the drawback of a high rate of evaporation, on account of the isopropanol's boiling point of just 82° C. This means that problems arise with regard to uniform etching and reproducibility of the pyramidal surface. In contrast to the etching solution based on ethylene glycol, the IPA-based etching solution tends toward large pyramids. According to Bressers et al., small pyramids can be achieved by using nitrogen to displace the dissolved oxygen during the etching process. But there are reports of laboratory experiments in which a 10 vol.% isopropanol etching solution, a nitrogen flow of 25 l/min and a process temperature of 80° C. are used. An enormous consumption of isopropanol must be expected for production application in tanks. This entails high costs since the durability of the etching solution is low on account of such a high volatilization of IPA. This simultaneously leads to high waste-disposal costs for the spent chemicals.

As regards the industrial production of solar cells, it is important to guarantee a constantly good electrical quality of the solar cells produced in large quantities. Constant good quality in terms of the shape of the pyramid structure and a uniform structuring of the total silicon surface must be ensured. The ability to vary the pyramid size within a certain range is also advantageous.

Neither the etching solution based on ethylene glycol nor the isopropanol-based solution are able, however, to meet these requirements simultaneously to a satisfactory extent. As summarized above, the aqueous alkaline etching solution to which ethylene glycol is added is indeed able to produce pyramids with a height of $\leq 2$ $\mu$m, but it cannot be used immediately. Yet precisely this is a drawback as regards industrial use. Although the etching solution that contains isopropanol can, on the other hand, be used immediately for texture etching, it does tend toward large pyramids and proves to be disadvantageous as a result of the isopropanol's high rate of evaporation, since this impairs the reproducibility of a uniform pyramidal texture.

The object of the present invention is therefore to provide a method for the wet chemical pyramidal texture etching of silicon surfaces which is able—analogous to the etching solution based on ethylene glycol—to generate reproducibly small ($\leq 2$ $\mu$m) pyramid sizes, with different sizes of pyramids being adjustable within a certain range or scatter, while simultaneously ensuring complete texturization of the silicon surface and at the same time reducing costs.

SUMMARY OF THE INVENTION

In an embodiment, the present invention provides a new and improved etching solution used for the pyramidal structuring of the silicon surface which comprises both isopropanol and an aqueous alkaline ethylene glycol solution. The aqueous alkaline ethylene glycol solution is advantageously reacted with oxygen, as is known for example from EP 0 477 424 A1. The greater the amount of oxygen reacted, the smaller the amount of ethylene glycol solution used in the etching solution. The object is surprisingly solved just by the simultaneous use of isopropanol and ethylene glycol in the etching solution, which also entails the following advantages. At the start of etching, the use of water which is already preheated and is hence low in oxygen—as also described by Bressers et al.—has a supportive effect in terms of small pyramids, but is not absolutely necessary because it can be compensated by a corresponding correction in the ratio of glycol. Preheated isopropanol—also described in Bressers et al.—is problematic for reasons of production technology.

The etching solution according to the invention is capable of texture immediately after production, i.e. an etching process can be performed directly after the solution's production.

The etching result is also relatively insensitive to the exact composition of the etching solution, i.e. precise optimization of the ratio of the individual dissolved components is not necessary, which is beneficial particularly in terms of industrial application.

Another advantage is the good reproducibility of the etching result. At the same time, the pyramid size is adjustable, while simultaneously ensuring complete texture of the silicon surface.

A further advantage is obtained in that the present invention's etching solution does not suffer as much from the disadvantage of a conventional etching solution based just on isopropanol, i.e. a considerable rate of evaporation. This means that the etching solution according to the invention can be used for etching over a much longer period than a conventional solution that is based on isopropanol alone. The etching solution therefore has to be replaced less frequently. This lowers costs since downtime is decreased, thus reducing the amount of waste chemicals to be disposed of.

Other objects and advantages of the present invention will become apparent from the following detailed description, taken in conjunction with the Drawings, in which:

DETAILED DESCRIPTION OF THE PREFERRED EMBODIMENT

Figure 1:
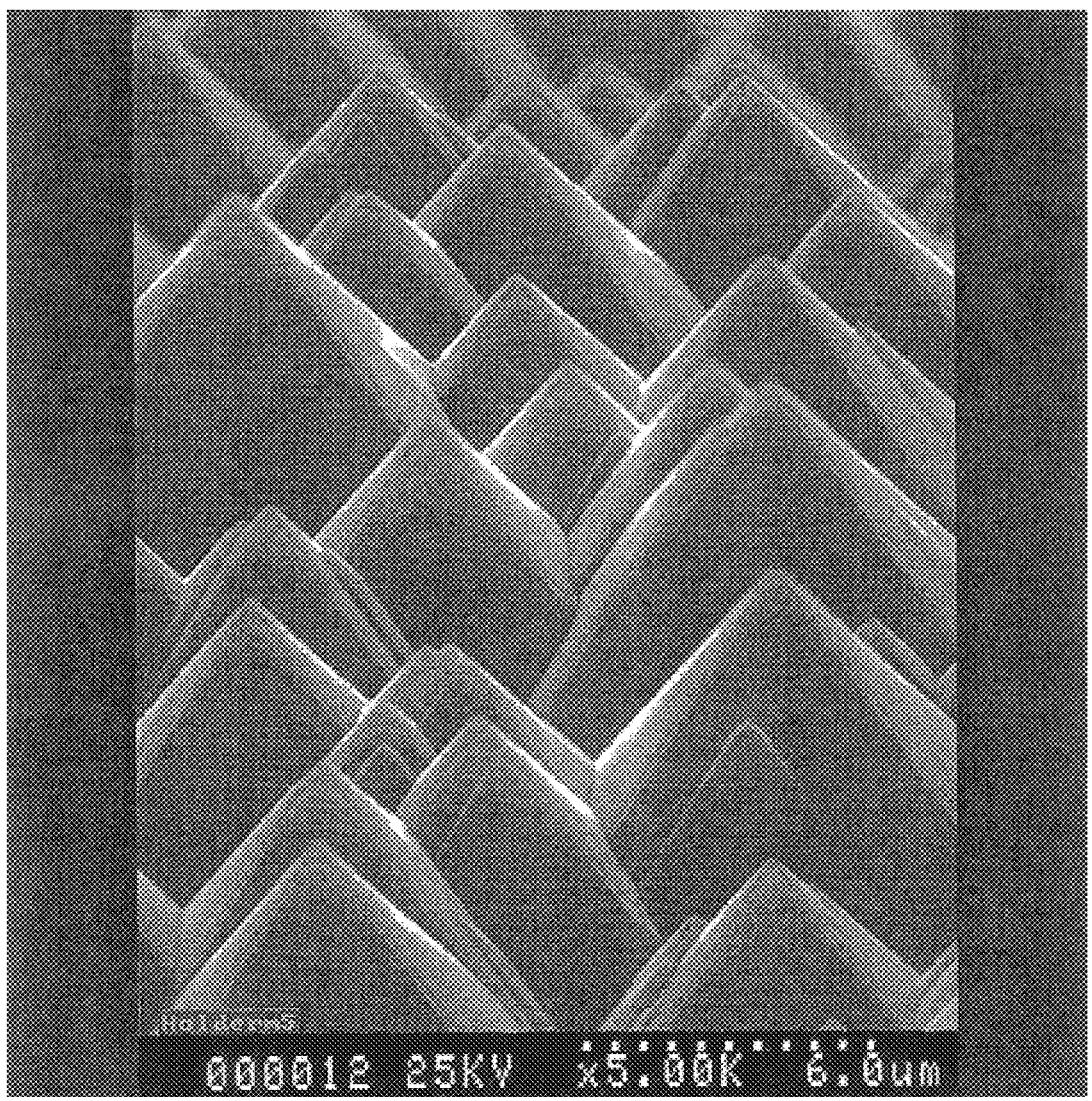
FIG. 1 shows a scanning electron micrograph of the etched surface of a first exemplary embodiment.

The solution according to the invention for etching a first exemplary embodiment is composed of 15 l water, 300 ml 50% sodium hydroxide solution, 400 ml dissolved silicate, 600 ml isopropanol and 15 ml aqueous alkaline ethylene glycol solution. The temperature of the etching solution was set to 78° C. and the silicon wafers were immersed into this solution for 20 minutes. The silicon wafers used here have a size of up to 6 inches, are etched in part down to a thinness of 120 $\mu$m and have reflecting surfaces before the etching process. A scanning electron micrograph of the surface of the silicon etched with this solution is shown in FIG. 1, depicting a uniform and complete pyramid structure some 6 $\mu$m in height.

Figure 2:
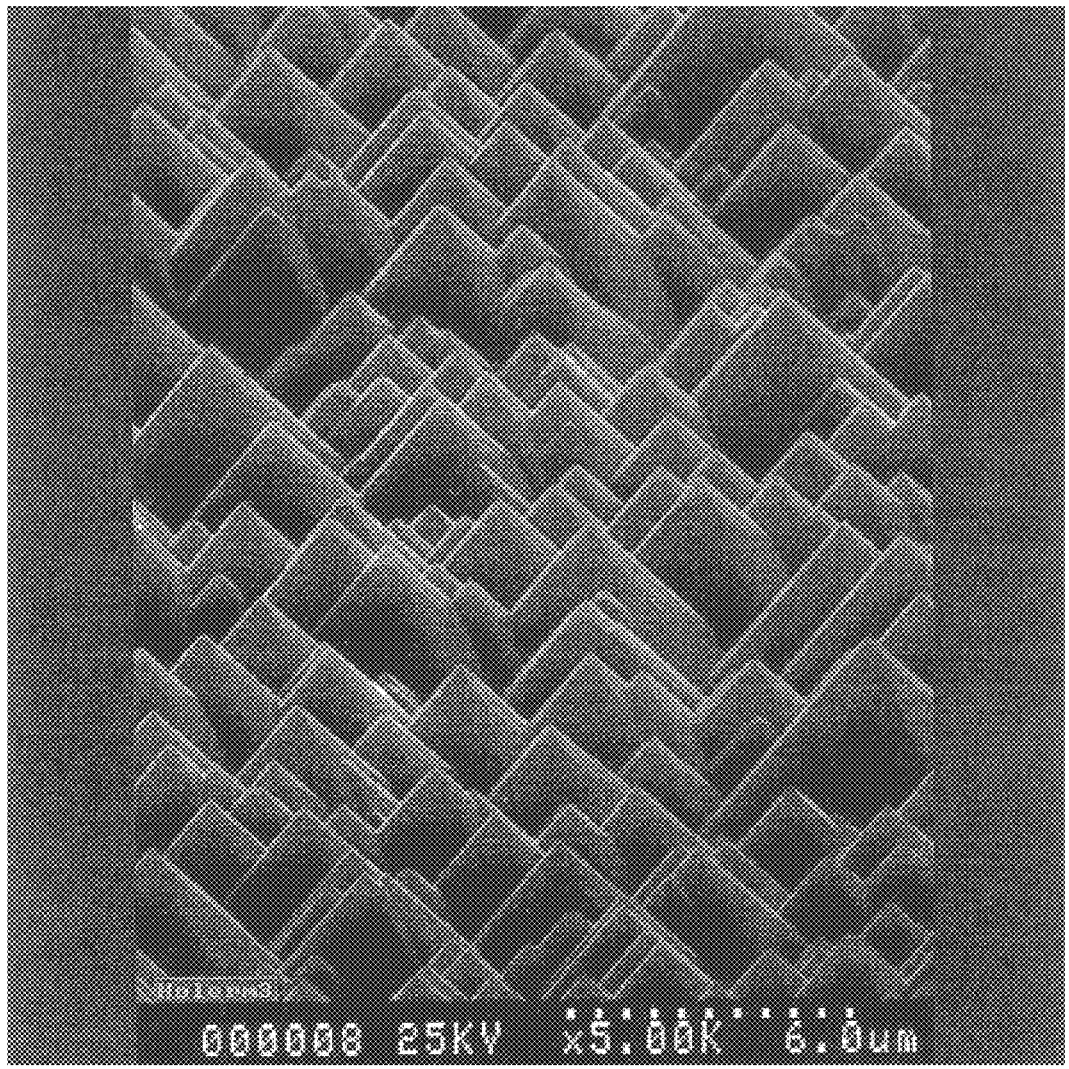
FIG. 2 shows a scanning electron micrograph of the etched surface of a second exemplary embodiment.

A second exemplary embodiment made use of an etching solution which comprises 15 l water, 600 ml 50% sodium hydroxide solution, 300 ml isopropanol and 30 ml aqueous alkaline ethylene glycol solution. Silicate was not added. This solution was heated to a temperature of 78° C. and the silicon wafers were immersed in this solution for 10 minutes. The surface of the silicon wafer structured with this etching solution is shown in FIG. 2. A uniform pyramidal silicon surface can be seen, the pyramid having a height of approximately 3 $\mu$m.

Figure 3:
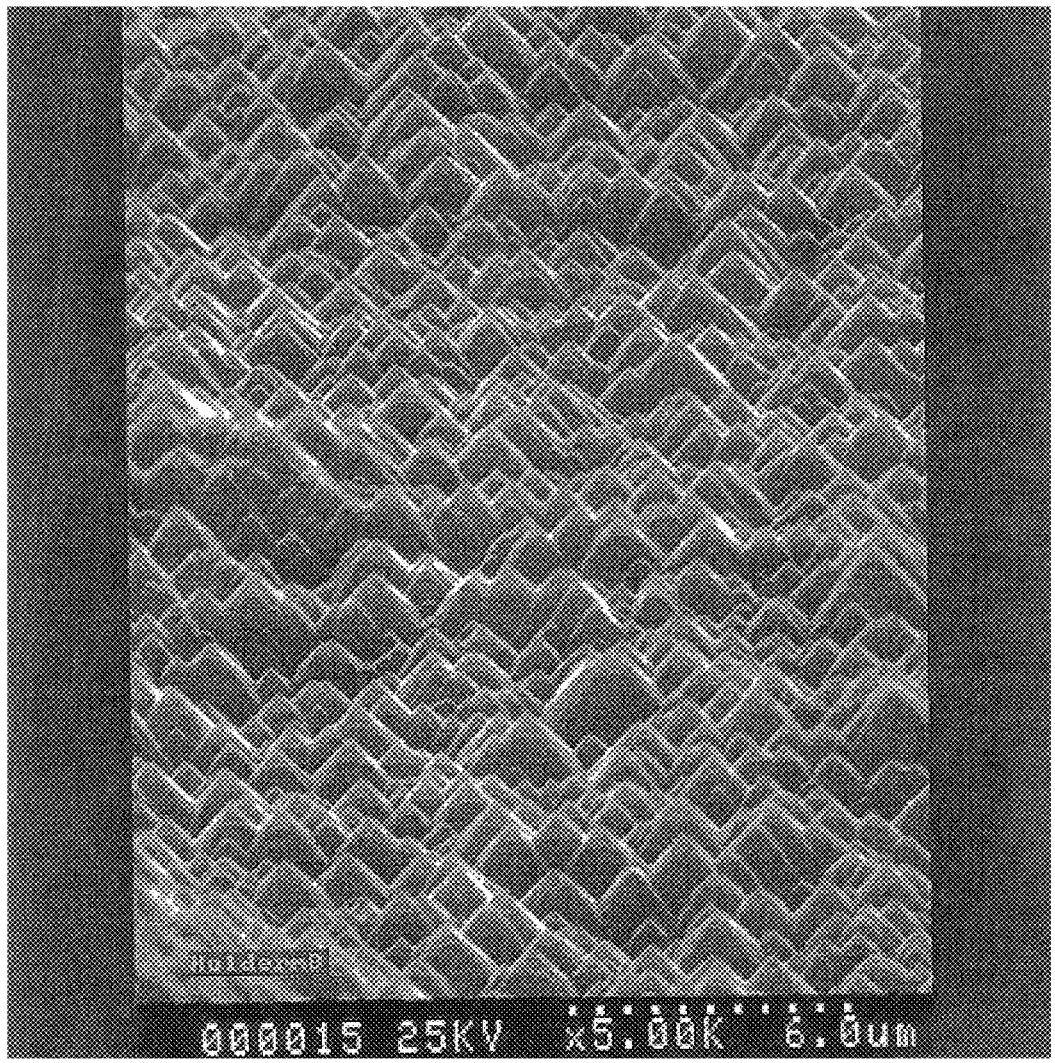
FIG. 3 shows a scanning electron micrograph of the etched surface of a third exemplary embodiment.

Another exemplary embodiment made use of an etching solution which contains 15 l water, 50 ml 50% sodium hydroxide solution, 100 ml isopropanol and 50 ml aqueous alkaline ethylene glycol solution, likewise without addition of silicate. This solution was also heated to a temperature of 78° C. and a subsequent etching process was performed for 5 minutes. The silicon surface structured with this solution is shown in the scanning electron micrograph depicted in FIG. 3. A uniform and complete pyramidal structure can also be identified here. The height of the pyramids is less than 1.5 $\mu$m.

Figure 4:
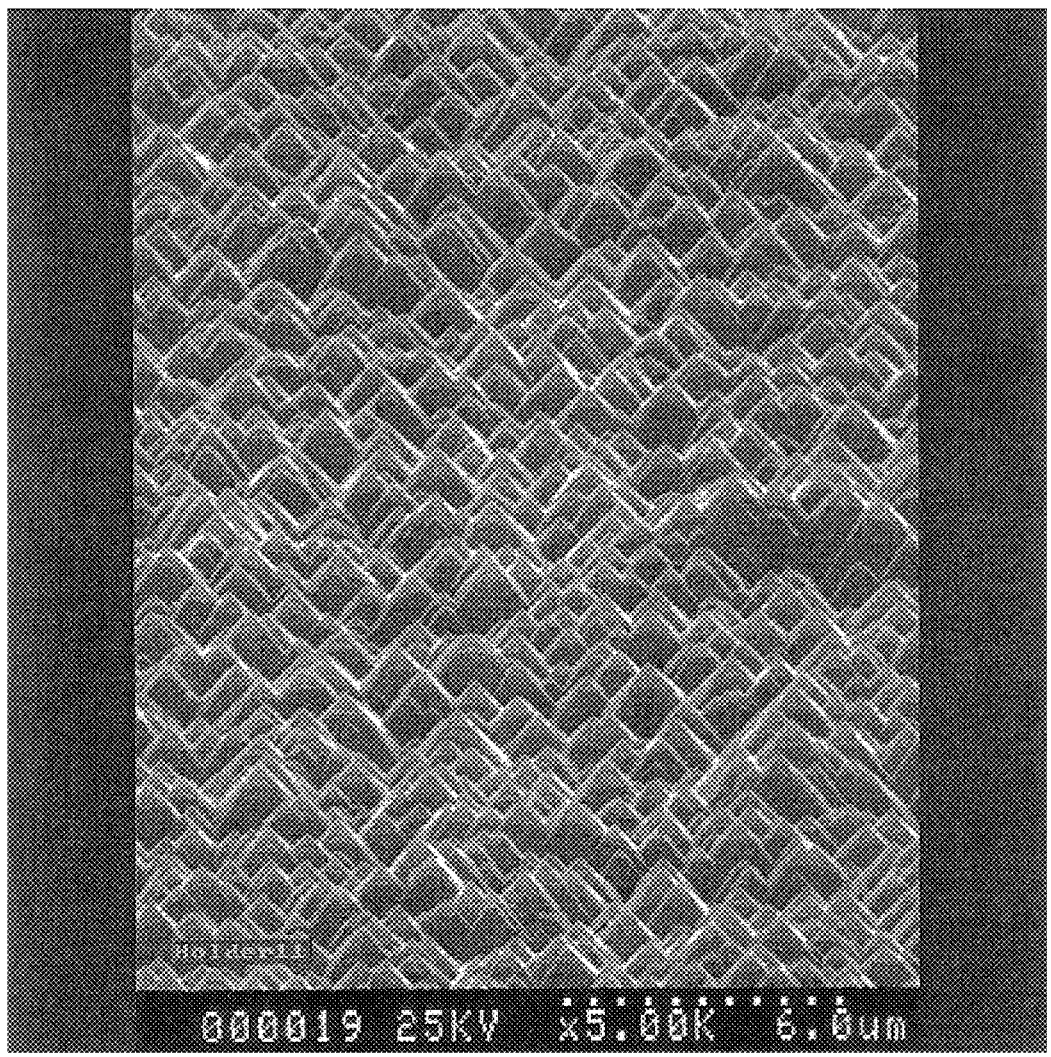
FIG. 4 shows a scanning electron micrograph of the etched surface of a fourth exemplary embodiment.

Further silicon samples were etched with an etching solution which contains 15 l water, 400 ml 50% sodium hydroxide solution, 400 ml isopropanol and 25 ml aqueous alkaline ethylene glycol solution (without addition of silicate). This solution was heated to a temperature of 60° C. and the silicon sample was then etched in this solution for 10 minutes. The result can be seen in FIG. 4. In this instance, the surface also exhibits a pyramidal structure having a height of approximately 1.5 $\mu$m.

The manner in which the pyramid size decreases as the ratio of glycol increases is apparent from exemplary embodiments 1 to 3. In the 4th exemplary embodiment, a more considerably aerated aqueous alkaline ethylene glycol solution is taken as a basis, for which reason it was possible to reduce the ratio here in order to generate pyramid sizes of $\leq 1.5$ $\mu$m, as in Example 3.

Each etching solution used in the exemplary embodiments can be used immediately after production, i.e. the etching solution is immediately capable of texturizing. A lengthy dissolution of silicon, as is necessary in the known solutions based on ethylene glycol, is omitted.

Although it is not necessary to add silicate, such an addition does not, however, have any disruptive effect either. This is evident for instance from the first exemplary embodiment in which 400 ml dissolved silicate is present in the etching solution. Uniform and complete pyramidal structuring was also achieved in this exemplary embodiment.

The proposed etching solution contains only a small amount of isopropanol of preferably about 2 to 5 vol.% in order to minimize isopropanol consumption.

It is also apparent from the exemplary embodiments described above that a precise optimization of the ratio of the individual dissolved components is not important because different concentrations of different ratios of dissolved components make satisfactory textures of the silicon surface possible. In other words, the process window of the etching solution according to the invention has a considerable size, which is particularly beneficial as regards an industrial structuring process. As is evident from the scanning electron micrographs of the individual exemplary embodiments, the pyramid size can also be varied by a different solution composition while ensuring constant reliable and complete structuring. The process temperature is set between 60° C. and 80° C. and the etching time varies between 5 and 10 minutes depending on the desired size of pyramid.

It should also be mentioned that naturally grown oxide formed when the silicon wafer to be etched has been standing for several weeks has just as little disruptive effect as for example a different silicon surface property (e.g. rough or polished).

To examine any possible influence of naturally grown oxide, wafer which had been previously standing in ambient air for several weeks were immersed into the etching solution in a dry state and any wafers which had been standing in the water rinsing basin for about 60 minutes before the etching step were dipped into the etching solution in a wet state. In both instances, naturally grown oxide does not interfere with the texture etching. A previous hydrofluoric acid dip for the removal of this oxide is unnecessary.

Any consumption of the etching solution can be compensated by addition of the necessary media. Such media do not have to be especially heated up in order to minimize, for example, any dissolved oxygen.

The etching solution according to the invention is suitable for various forms of media movement. Bubblers, stirring devices, lifting apparatus or pump circulation of the solution are possible, as is a combination of such equipment.

What is claimed is:

1. A method for the wet chemical pyramidal texture etching of silicon surfaces, comprising the steps of:

preparing an etching solution comprising water, an alkaline reagent, isopropanol and an aqueous alkaline ethylene glycol solution; and thereafter, contacting a silicon surface with said etching solution to provide wet chemical pyramidal texture etching of the silicon surface.

2. A method as defined in claim 1, wherein in the preparing step, silicate is added to the etching solution.

3. A method as defined in claim 1, wherein the etching solution contains 0.5 to 5 vol.% isopropanol.

4. A method as defined in claim 1, wherein the proportion of isopropanol present in the etching solution is greater than the proportion of ethylene glycol solution.

5. A method as defined in claim 4, wherein the ratio of isopropanol to ethylene glycol solution is at maximum 1:1.

6. A method as defined in claim 1, wherein during the contacting step, the etching solution has a temperature between about 60° C. and about 80° C.

7. A method as defined in claim 1, wherein during the contacting step, the silicon surface is contacted for an etching period of from about 5 to about 20 minutes.

8. A method as defined in claim 1, wherein the aqueous alkaline ethylene glycol solution is reacted with oxygen.

9. A method for the wet chemical pyramidal texture etching of silicon surfaces, comprising the steps of:

preparing an etching solution comprising water, sodium or potassium hydroxide and simultaneously isopropanol and an aqueous alkaline ethylene glycol solution; and thereafter, contacting a silicon surface with said etching solution to provide wet chemical pyramidal texture etching of the silicon surface.

10. A method as defined in to claim 9, wherein in the preparing step silicate is added to the etching solution.

11. A method as defined in claim 9, wherein the etching solution contains 0.5 to 5 vol.% isopropanol.

12. A method as defined in claim 9, wherein the proportion of isopropanol present in the etching solution is greater than the proportion of ethylene glycol solution.

13. A method as defined in claim 12, wherein the ratio of isopropanol to ethylene glycol solution is at maximum 1:1.

14. A method as defined in claim 9, wherein in the contacting step the etching solution has a temperature between about 60° C. and about 80° C.

15. A method as defined in claim 9, wherein in the contacting step, the etching solution is contacted with the silicon surface for an etching period of from about 5 to about 20 minutes.

16. A method as defined in claim 9, wherein the aqueous alkaline ethylene glycol solution is reacted with oxygen.

* * * * *

UNITED STATES PATENT AND TRADEMARK OFFICE
CERTIFICATE OF CORRECTION

PATENT NO.      : 6,451,218 B1  Page 1 of 1
DATED           : September 17, 2002
INVENTOR(S)     : Konstantin Holdermann It is certified that error appears in the above-identified patent and that said Letters Patent is hereby corrected as shown below:

Column 6,
Line 10, after the word "in", delete the word "to"

Signed and Sealed this

Twenty-sixth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,451,218 B1
DATED         : September 17, 2002
INVENTOR(S)   : Konstantin Holdermann It is certified that error appears in the above-identified patent and that said Letters Patent is hereby corrected as shown below:

<u>Title page,</u>
Item [73], Assignee, replace "Siemens Solar GmbH, Munich (DE)" with -- Siemens und Shell Solar GmbH, Munich (DE) --.

Signed and Sealed this

Twenty-first Day of October, 2003

JAMES E. ROGAN
*Director of the United States Patent and Trademark Office*